(12) United States Patent
Xiao et al.

(10) Patent No.: US 12,015,113 B2
(45) Date of Patent: Jun. 18, 2024

(54) BONDING METHOD, DISPLAY BACKPLANE AND SYSTEM FOR MANUFACTURING DISPLAY BACKPLANE

(71) Applicant: CHONGQING KONKA PHOTOELECTRIC TECHNOLOGY RESEARCH INSTITUTE CO., LTD., Chongqing (CN)

(72) Inventors: Shoujun Xiao, Chongqing (CN); Tzu-ping Lin, Chongqing (CN); Shan-Fu Yuan, Chongqing (CN); Liu-chung Lee, Chongqing (CN); Chung-yu Chou, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 0 days.

(21) Appl. No.: 17/424,173

(22) PCT Filed: Apr. 30, 2020

(86) PCT No.: PCT/CN2020/088378
§ 371 (c)(1),
(2) Date: Jul. 20, 2021

(87) PCT Pub. No.: WO2021/217607
PCT Pub. Date: Nov. 4, 2021

(65) Prior Publication Data
US 2023/0043726 A1    Feb. 9, 2023

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC . H01L 2224/11003; H01L 2224/11002; H01L 2224/759–75925;
(Continued)

(56) References Cited

U.S. PATENT DOCUMENTS 5,821,627 A * 10/1998 Mori ...................... H05K 3/328
                                                      257/781
11,329,034 B2 * 5/2022 Tao ..................... H01L 21/3212
(Continued)

FOREIGN PATENT DOCUMENTS

CN    107017319 A    8/2017
CN    109326549 A    2/2019
(Continued)

OTHER PUBLICATIONS

International Search Report for corresponding application PCT/CN2020/088378 filed Apr. 30, 2020; Mail date Jan. 27, 2021.

*Primary Examiner* — Nicholas J Tobergte
*Assistant Examiner* — William Henry Anderson
(74) *Attorney, Agent, or Firm* — Samson G. Yu

(57) ABSTRACT

The application discloses a bonding method, a display backplane and a system for manufacturing the display backplane. The method includes: providing a substrate, and forming a plurality of first metal bumps on the substrate; providing a transfer device to transfer the plurality of the first metal bumps to a TFT substrate to form a plurality of pairs of metal pads on the TFT substrate, wherein each pair of the metal pads include two of the first metal bumps; and providing a plurality of LED flip chips, and transferring the plurality of LED flip chips to the TFT substrate by using the
(Continued)

transfer device to bond electrodes of each of the LED flip chips to one pair of the metal pads respectively.

10 Claims, 2 Drawing Sheets

(51) Int. Cl.
*H01L 25/16* (2023.01)
*H01L 33/00* (2010.01)
*H01L 33/38* (2010.01)

(52) U.S. Cl.
CPC ............ *H01L 33/005* (2013.01); *H01L 33/38* (2013.01); *H01L 2224/11001* (2013.01); *H01L 2224/11002* (2013.01); *H01L 2224/11003* (2013.01); *H01L 2933/0016* (2013.01); *H01L 2933/0066* (2013.01)

(58) Field of Classification Search
CPC .... H01L 2224/93–95; H01L 2224/111–11916; H01L 2224/08502; H01L 2224/08506; H01L 2224/16502; H01L 2224/16506; H01L 2224/32502; H01L 2224/32506; H01L 2224/80805; H01L 2224/81805; H01L 2224/82805; H01L 2224/83805; H01L 2924/01322–01324
See application file for complete search history.

(56) References Cited

U.S. PATENT DOCUMENTS

| | | | |
|---|---|---|---|
| 2010/0025863 A1* | 2/2010 | Gruber | H01L 23/49816 257/E23.079 |
| 2017/0215280 A1* | 7/2017 | Chaji | H05K 13/04 |
| 2018/0277728 A1 | 9/2018 | Takeya et al. | |
| 2019/0081200 A1* | 3/2019 | Ting | H01L 24/81 |
| 2019/0088196 A1* | 3/2019 | Chu | G09G 3/2003 |
| 2019/0295992 A1 | 9/2019 | Ahmed et al. | |

FOREIGN PATENT DOCUMENTS

| | | |
|---|---|---|
| CN | 109478580 A | 3/2019 |
| CN | 109786307 A | 5/2019 |
| CN | 110148655 A | 8/2019 |
| CN | 110212079 A | 9/2019 |
| CN | 110600497 A | 12/2019 |
| JP | 2020053558 A | 4/2020 |

* cited by examiner

BONDING METHOD, DISPLAY BACKPLANE AND SYSTEM FOR MANUFACTURING DISPLAY BACKPLANE

TECHNICAL FIELD

The application relates to the technical field of Micro LEDs, in particular to a bonding method, a display backplane and a system for manufacturing the display backplane.

BACKGROUND

Compared with other existing display technology (LCD, PDP, OLED, etc.), Micro LED technology has the advantages of high brightness, high contrast, wide color gamut, large viewing angles, low power consumption, long lives, ultra-thin flexible display, etc., and is the ultimate display technology in the future. Since Micro LED flip chips are small in size (<100 μm) and large in number, mass transfer technology of the LED flip chips is the main bottleneck of current Micro LED technology. Different from traditional large-size LEDs and Mini LEDs which can use a bonding mode of soldering, die bonding or reflow soldering, Micro LEDs can only use the bonding mode of metal eutectic (which is not supported by the aperture limit of a soldering stencil). That is to say, a substrate Pad and an LED flip chip Pad are separately plated with metal with a certain thickness, and an interface melts in the process of mass transfer bonding to form a eutectic alloy for completing mechanical and electrical interconnection. At present, a eutectic alloy with a low melting point such as Au—In is mainly used.

On the other hand, at present, compared with PCB substrates, Micro LED display based on TFT substrates becomes increasingly popular among major manufacturers since it has the advantages of being ultra-thin, transparent, low in cost, convenient in realization of active drive, etc. However, due to limit of devices and processes, pads of existing TFT substrate factories can only be made from aluminum (Al), titanium (Ti), molybdenum (Mo), nickel (Ni), copper (Cu), Indium tin oxide (ITO), etc., which can't be effectively bonded to LED Pads, and still need Under Bump Metal (UBM) stack-up even if Au—In eutectic bonding is used. However, in order to make UBM, firstly, it is necessary to cut a large-sized substrate into small sizes (limited by UBM evaporation devices), then multi-layers of metal (Ti, Ni, etc.) is evaporated on the substrate Pad to form UBM stackup, and then metal (such as In) is evaporated and bonded to the UBM structure to form BUMP shape, which greatly increases complexity of the process, but is also limited by a supportable size of the UBM devices.

Therefore, the prior art needs to be improved and upgraded.

SUMMARY

The technical problem to be solved by the application is to provide a bonding method, a display backplane and a system for manufacturing the backplane aiming at the defects of the prior art, so as to solve the problem that an existing substrate material may not directly support LED flip chip bonding, and also avoid the technological complexity problem that a TFT substrate is cut into small sizes to make a UBM structure.

A technical solution used by the application uses for solving the technical problem above is as below:

In a first aspect, the disclosure provides a bonding method. The method includes: providing a substrate, and forming a plurality of first metal bumps on the substrate; providing a transfer device to transfer the plurality of the first metal bumps to a TFT substrate to form a plurality of pairs of metal pads on the TFT substrate, wherein each pair of the metal pads include two of the first metal bumps; and providing a plurality of LED flip chips, and transferring the plurality of LED flip chips to the TFT substrate by using the transfer device to bond electrodes of each of the LED flip chips to one pair of the metal pads respectively.

Optionally, the method further includes: providing a first electrical performance detection device to detect electrical performance of each of the LED flip chips on the TFT substrate to obtain a detection result; determining whether each of the LED flip chips on the TFT substrate is bonded to each pair of the metal pads according to the detection result; and under the condition that any one of the LED flip chips is not bonded to the metal pad which is contacted with the LED flip chip, repairing the LED flip chip, repairing the LED flip chip.

Optionally, providing the substrate to form the plurality of first metal bumps on the substrate includes: coating the substrate with a release adhesive; sequentially evaporating a first metal layer, a second metal layer and a third metal layer on the release adhesive to form a metal pad layer; and patterning the metal pad layer to form the plurality of first metal bumps.

Optionally, before transferring the plurality of LED flip chips to the TFT substrate by using the transfer device, the method further includes: forming second metal bumps on the electrodes of each of the LED flip chips by means of evaporation to form a plurality of new LED flip chips; and transferring the plurality of LED flip chips to the TFT substrate by using the transfer device to bond the electrodes of each of the LED flip chips to one pair of the metal pads respectively includes: transferring the plurality of new LED flip chips to the TFT substrate by using the transfer device, such that two of the second metal bumps on each of the new LED flip chips form eutectic bonding with the third metal layers in two first metal bumps in one pair of the metal pads.

In a second aspect, the disclosure further provides a display backplane. The display backplane includes a plurality of first metal bumps, a TFT substrate, wherein the plurality of first metal bumps are transferred to the TFT substrate and the plurality of first metal bumps are eutectically bonded to metal pad blocks on the TFT substrate; and a plurality of LED flip chips, wherein the plurality of LED flip chips are transferred to the TFT substrate, and the plurality of LED flip chips are eutectically bonded to the plurality of first metal bumps on the TFT substrate respectively.

Optionally, the first metal bump includes a first metal layer, a second metal layer and a third metal layer, wherein the first metal layer is eutectically bonded to the metal pad block, the second metal layer is arranged on the first metal layer, and the third metal layer is arranged on the second metal layer.

Optionally, the LED flip chip includes a light emitting diode and two second metal bumps; wherein one ends of the two second metal bumps are respectively bound on two electrodes of the light emitting diode; and the other ends of the two second metal bumps are eutectically bonded to two of the third metal layers.

In a third aspect, the disclosure further provides a system for manufacturing a display backplane. The system includes: a substrate, wherein the substrate includes a plurality of first metal bumps; a TFT substrate, wherein a plurality of metal pad blocks is set on the TFT substrate; a plurality of LED flip chips, and a transfer device, wherein the transfer device is used for transferring the plurality of first metal bumps to the TFT substrate so as to eutectically bond the plurality of first metal bumps to the metal pad blocks on the TFT substrate; and the transfer device is further used for transferring the plurality of LED flip chips to the TFT substrate, such that the plurality of LED flip chips are eutectically bonded to the plurality of the first metal bumps on the TFT substrate separately.

Optionally, the system for manufacturing the display backplane further includes: a first electrical performance detection device, configured to detect electrical performance of each of the LED flip chips on the TFT substrate.

Optionally, the system for manufacturing the display backplane further includes: a second electrical performance detection device, configured to detect whether the metal pad block on the TFT substrate is bonded to the first metal bump.

Compared with the prior art, the application provides the bonding method, the display backplane and the system for manufacturing the display backplane. The method includes: providing the substrate, and forming the plurality of first metal bumps on the substrate; providing the transfer device to transfer the plurality of the first metal bumps to the TFT substrate to form the plurality of pairs of metal pads on the TFT substrate, wherein each pair of the metal pads include two of the first metal bumps; and providing the plurality of LED flip chips, and transferring the plurality of LED flip chips to the TFT substrate by using the transfer device, to bond electrodes of each of the LED flip chips to one pair of the metal pads respectively. It can thus be seen that the application has a simpler technological process, and realizes effective bonding between the LED flip chip and the TFT substrate with high reliability.

DETAILED DESCRIPTION OF THE EMBODIMENTS

The application provides a bonding method, a display backplane and a system for manufacturing the display backplane. In order to make a purpose, a technical solution and effect of the application clearer and more specific, the application will be further described in detail blow with reference to the attached drawings and giving embodiments. It should be understood that the particular embodiments described herein are merely used to explain the application, and are not used to limit the application.

It can be understood by those skilled in the art that singular forms "a/an", "one", "said" and "the" used herein may also include plural forms unless expressly stated. It should be further understood that the word "comprise/ include" used in the specification of the application means presence of stated features, integers, steps, operations, elements and/or components, but does not exclude the presence or addition of one or more other features, integers, steps, operations, elements, components and/or groups thereof. It should be understood that when we say that an element is "connected" or "coupled" to another element, it may be directly connected or coupled to another element, or through an intermediate element. In addition, "connected" or "coupled" as used herein may include wireless connection or wireless coupling. Words "and/or" as used herein includes all or any unit and all combinations of one or more associated listed items.

It can be understood by those skilled in the art that unless otherwise defined, all terms (including technical terms and scientific terms) used herein have the same meanings as those generally understood by those skilled in the art to which the application belongs. It should also be understood that terms such as those defined in a general dictionary should be understood to have meanings consistent with those in the context of the prior art, and will not be interpreted in idealized or overly formal meanings unless specifically defined as herein.

The following will further describe the summary of the application through description of the embodiments and with reference to the accompanying drawings.

Figure 1:
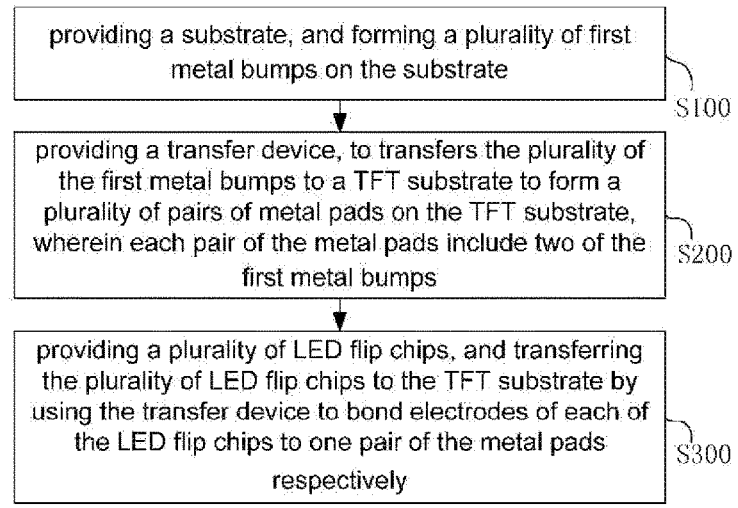
FIG. 1 is a flowchart of a bonding method provided by the application.
Figure 2:
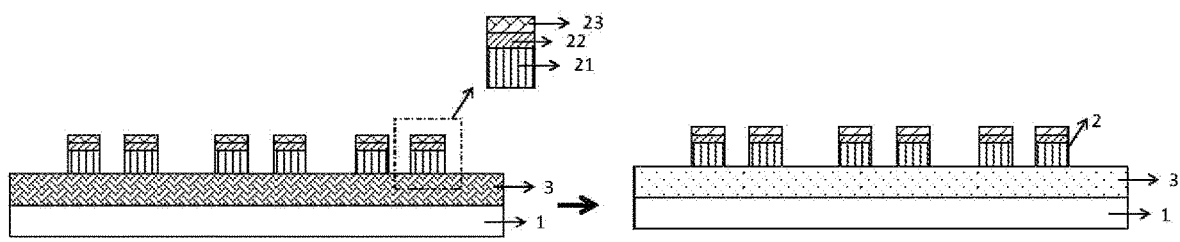
FIG. 2 is a schematic diagram of one of bonding processes provided by the application.

This embodiment provides a bonding method. As shown in FIG. 1, the method includes:

S100. A substrate 1 is provided, and a plurality of first metal bumps 2 are formed on the substrate 1.

Particularly, as shown in FIGS. 2, 3, 4, 5 and 6, the substrate 1 includes the plurality of first metal bumps 2. The first metal bump 2 includes a first metal layer 21, a second metal layer 22 and a third metal layer 23, wherein the first metal layer 21 is eutectically bonded to a metal pad block 6 on a TFT substrate 5, the second metal layer 22 is arranged on the first metal layer 21, and the third metal layer 23 is arranged on the second metal layer 22.

In this embodiment, forming the plurality of first metal bumps 2 on the substrate 1 includes:

S101. coating the substrate 1 with a release adhesive 3;

S102. sequentially evaporating a first metal layer 21, a second metal layer 22 and a third metal layer 23 on the release adhesive 3 to form a metal pad layer; and S103. patterning the metal pad layer to form the plurality of first metal bumps 2.

In this embodiment, in a process of manufacturing the first metal bump 2, by using a photo process of an existing LED factory, the substrate 1 with the release adhesive 3 is sequentially provided with three layers of metal, including the first metal layer 21, the second metal layer 22 and the third metal layer 23. The first metal layer 21 is mainly used to realize bonding between the first metal bump 2 and the metal pad block 6 on the TFT substrate 5, corresponding metal is selected according to different metal types of the metal pad blocks 6, and if a metal type corresponding to the metal pad block 6 is copper (Cu), the first metal layer 21 may be stannum (Sn). The second metal layer 22 is mainly used to realize connection and diffusion barrier between the first metal layer 21 and the third metal layer 23, so the second metal layer 22 may be titanium (Ti). The third metal layer 21 is mainly used to achieve bonding the first metal bump 2 and the metal pad block 6 and forming eutectic bonding with a second metal bump 92 formed by means of evaporation on an electrode 91 of an LED flip chip 9, different metal may be selected according to a metal type of the second metal bump 92, for example, if the second metal bump 92 is indium (In), the third metal layer 23 may be gold (Au).

In this embodiment, coating with a photoresist 3 is performed after evaporation of the three layers of metal above, and the photoresist is patterned after one-time exposure and development. The part covered with the photoresist is the part that needs to be left, and the other part not covered with the photoresist is unnecessary. A metal layer not covered with the photoresist is removed through wet etching, then the remaining photoresist is peeled off to obtain the first metal bump 2 with the same size as that of the metal pad block 6, then the first metal layer 21 is transferred to the substrate 1 by using the release property of the release adhesive 3 so as to be subjected to mass transfer conveniently. Optionally, the release adhesive 3 may be a pyrolytic adhesive or a photolysis adhesive, or other adhesive materials with peeling effect. For example, in the case of the photolysis adhesive, the photolysis adhesive is irradiated with light of a certain wavelength to lose viscosity, so as to achieve the purpose of releasing the metal bump. In addition, the TFT substrate is further provided with an insulation protection layer 7.

S200. A transfer device 4 is provided, the transfer device 4 transferring the plurality of first metal bumps 2 to the TFT substrate 5 to form a plurality of pairs of metal pads on the TFT substrate 5, wherein each pair of the metal pads includes two first metal bumps 2.

Figure 3:
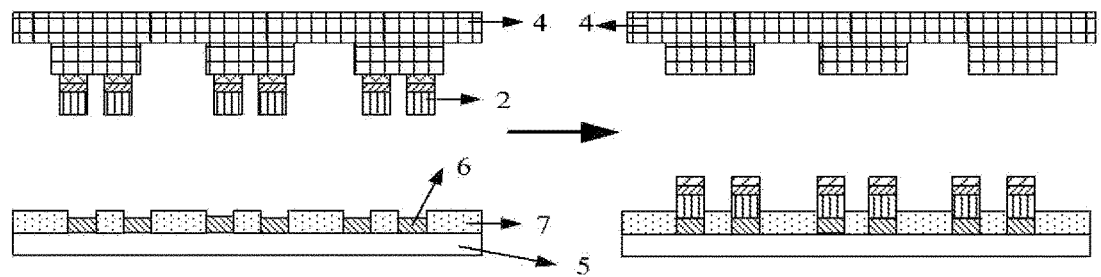
FIG. 3 is a schematic diagram of one of bonding processes provided by the application.

Particularly, as shown in FIG. 3, the transfer device 4 is used for transferring the plurality of first metal bumps 2 to the TFT substrate 5 so as to eutectically bond the plurality of first metal bumps 2 to the metal pad blocks 6 on the TFT substrate 5, wherein the TFT substrate 5 is provided with the plurality of metal pad blocks 6.

Further, in one implementation of this embodiment, the method further includes:

M01. A second electrical performance detection device 8 is provided, the second electrical performance detection device 8 is used for detecting whether the metal pad block 6 on the TFT substrate 5 is bonded to the first metal bump 2.

Particularly, in order to avoid defects after bonding between the metal pad block 6 and the first metal bump 2 in the application, the second electrical performance detection device 8 detects whether the bonding between the metal pad block 6 on the TFT substrate 5 and the first metal bump 2 is successful, such that the first metal bump 2 may be transferred again after repair if the bonding fails.

S300. A plurality of LED flip chips 9 are provided, and the plurality of LED flip chips 9 are transferred to the TFT substrate 5 by using the transfer device 4, such that electrodes 91 of each of the LED flip chips 9 are separately bonded to one pair of the metal pads.

Figure 5:
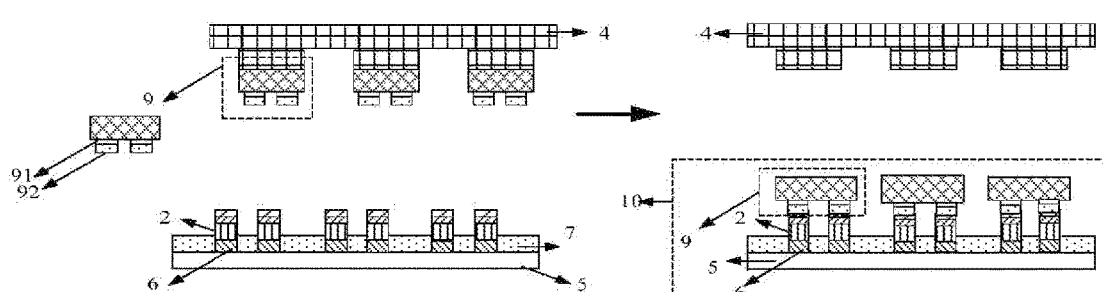
FIG. 5 is a schematic diagram of one of bonding processes provided by the application.
Figure 6:
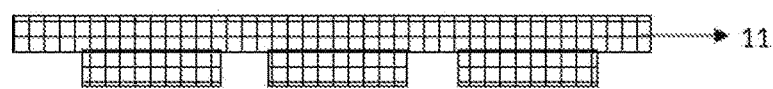
FIG. 6 is a structural schematic diagram of a second electrical performance detection device provided by the application.

Particularly, as shown in FIG. 5, the LED flip chip 9 includes a light emitting diode and two second metal bumps 92. One ends of the two second metal bumps 92 are separately bound on two electrodes 91 of the light emitting diode, and the other ends of the two second metal bumps 92 are eutectically bonded to two of the third metal layers 23. The plurality of LED flip chips 9 are transferred to the TFT substrate 5, the plurality of LED flip chips 9 are eutectically bonded to the plurality of first metal bumps 2 on the TFT substrate 5 separately, such that the transfer device 4 is further used for transferring the plurality of LED flip chips 9 to the TFT substrate 5, such that the plurality of LED flip chips 9 are eutectically bonded to the plurality of first metal bumps 2 on the TFT substrate 5 separately.

Further, before transferring the plurality of LED flip chips 9 to the TFT substrate 5 by using the transfer device 4, the method further includes:

S10. Second metal bumps 92 is formed by means of evaporation on the electrodes 91 of each of the LED flip chips 9 to form a plurality of new LED flip chips.

Particularly, the second metal bump 92 is composed of a fourth metal layer, and the fourth metal layer (for example In) is evaporated on the electrode 91 on the LED flip chip 9 to form the second metal bump 92. Correspondingly, the transferring the plurality of LED flip chips 9 to the TFT substrate 5 by using the transfer device 4, such that electrodes 91 of each of the LED flip chips 9 are separately bonded to one pair of the metal pads includes: transferring the plurality of new LED flip chips 9 to the TFT substrate 5 by using the transfer device 4, such that two second metal bumps 92 on each new LED flip chip 5 form eutectic bonding with the third metal layers 23 in two of the first metal bumps 2 in one pair of the metal pads.

Particularly, in the application, the LED flip chip 9 is transferred to the TFT substrate 5 by using the transfer device 4. In this embodiment, the TFT substrate 5 is placed on a heatable carrier during a transfer process, and a heating temperature reaches a melting temperature of a eutectic alloy used. The transfer device 4 picks up and places the new LED flip chip 9 on the TFT substrate 5, certain pressure is applied at the same time, under the action of the temperature and the pressure, two second metal bumps 92 on the LED flip chip 9 separately form eutectic bonding (Au—In) with the third metal layers 23 in the two of the first metal bumps 2 in one pair of the metal pads. Since a eutectic bonding temperature this time is lower than that of first (Cu—Sn) bonding, it will not affect a first bonding point. Therefore, melting points of the second metal bump 92 and the electrode 91 are lower than those of the first metal layer 21 and the metal pad block 6. Preferably, a temperature range is 150-200° C.

Further, in one implementation of this embodiment, the method further includes:

S01. a first electrical performance detection device 11 is provided, the first electrical performance detection device 11 performing electrical performance detection on each of the LED flip chips 9 on the TFT substrate 5 to obtain a detection result;

S02. whether each of the LED flip chips 9 on the TFT substrate 5 is bonded to each pair of the metal pads is determined according to the detection result; and S03. if any one of the LED flip chips 9 is not bonded to the metal pad in contact therewith, the LED flip chip 9 is repaired.

Particularly, the application further provides the first electrical performance detection device 11, which may perform electrical performance detection on each of the LED flip chips 9 on the TFT substrate 5. Since the bonding between the LED flip chip 9 on the TFT substrate 5 and the corresponding metal pad may be bad, such as non-conduction, bonding may be conveniently performed again after repair.

Based on the above bonding method, the application further provides a display backplane 10. As shown in FIG. 5, the display backplane includes a plurality of first metal bumps 2, a TFT substrate 5, wherein the plurality of first metal bumps 2 is transferred to the TFT substrate 5 and are eutectically bonded to metal pad blocks 6 on the TFT substrate 5; and a plurality of LED flip chips 9, wherein the plurality of LED flip chips 9 is transferred to the TFT substrate 5, and the plurality of LED flip chips 9 is eutectically bonded to the plurality of first metal bumps 2 on the TFT substrate 5 separately.

Optionally, the first metal bump 2 includes a first metal layer 21, a second metal layer 22 and a third metal layer 23, wherein the first metal layer 21 is eutectically bonded to the metal pad block 6, the second metal layer 22 is arranged on the first metal layer 21, and the third metal layer 23 is arranged on the second metal layer.

Further, the LED flip chip 9 includes a light emitting diode and two second metal bumps 92. One ends of the two second metal bumps 92 are respectively bound on two electrodes 91 of the light emitting diode, and the other ends of the two second metal bumps 9 are eutectically bonded to two of the third metal layers 23.

Based on the above bonding method, the application further provides a system for manufacturing a display backplane. The system includes a substrate 1, wherein the substrate 1 includes a plurality of first metal bumps 2; a TFT substrate 5, wherein a plurality of metal pad blocks 6 is set on the TFT substrate; a plurality of LED flip chips 9; and a transfer device 4, the transfer device 4 being used for transferring the plurality of first metal bumps 2 to the TFT substrate 5 so as to eutectically bond the plurality of first metal bumps 2 to the metal pad blocks 6 on the TFT substrate 5; and the transfer device 4 being further used for transferring the plurality of LED flip chips 9 to the TFT substrate 5, such that the plurality of LED flip chips 9 are eutectically bonded to the plurality of first metal bumps 2 on the TFT substrate 5 separately.

In this embodiment, the system for manufacturing the display backplane further includes: a first electrical performance detection device, configured to detect electrical performance of each of the LED flip chips 9 on the TFT substrate 5.

Figure 4:
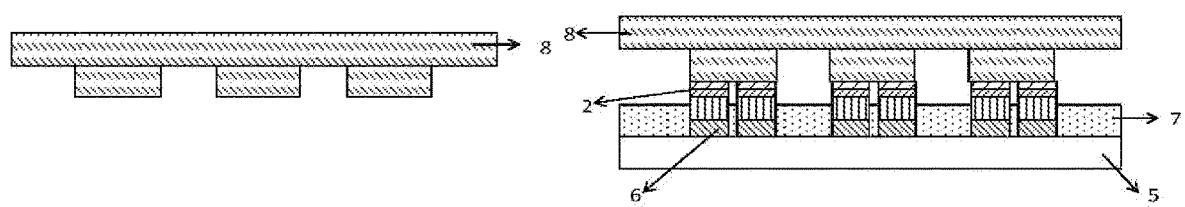
FIG. 4 is a schematic diagram of one of bonding processes provided by the application.

In this embodiment, as shown in FIG. 4, the system for manufacturing the display backplane further includes: a second electrical performance detection device 8, configured to detect whether the metal pad block 6 on the TFT substrate 5 is bonded to the first metal bump 2. It should be noted that the first electrical performance detection device and the second electrical performance detection device 8 may or may not be the same, which is not limited in the application.

To sum up, the application disclose the bonding method, the display backplane and the system for manufacturing the display backplane. The method includes: providing the substrate 1, and forming the plurality of first metal bumps 2 on the substrate 1; providing the transfer device 4 to transfer the plurality of the first metal bumps 2 to a TFT substrate 5 to form a plurality of pairs of metal pads on the TFT substrate 5, wherein each pair of the metal pads including two of the first metal bumps 2; and providing the plurality of LED flip chips 9, and transferring the plurality of LED flip chips 9 to the TFT substrate 5 by using the transfer device 4, to bond electrodes 91 of each of the LED flip chips 9 to one pair of the metal pads respectively. It can thus be seen that the application has a simpler technological process, and realizes effective bonding between the LED flip chip 9 and the TFT substrate 5 with high reliability. In addition, the application overcomes the problem that existing Pad materials in panel factories may not directly support bonding of LEDs, and also avoids the technological complexity problem that a TFT substrate is cut into small sizes to make a UBM structure. In the solution, an existing lithography process and mass transfer process are utilized to achieve effective bonding between the Micro LED and the TFT substrate under the conditions of less investment in equipment and resources and high process reliability.

Finally, it should be noted that the above embodiments are merely used to describe the technical solution of the application, rather than limiting the same. Although the application has been described in detail with reference to the foregoing embodiments, those skilled in the art should understand that the technical solution described in the foregoing embodiments may still be modified, or some of the technical features therein may be equivalently replaced. However, these modifications or substitutions do not make the essence of the corresponding technical solutions deviate from the spirit and scope of the technical solutions of each embodiment of the application.

What is claimed is:

1. A bonding method, comprising:
   providing a substrate, and forming a plurality of first metal bumps on the substrate;
   providing a transfer device to transfer the plurality of the first metal bumps to a TFT substrate to form a plurality of pairs of metal pads on the TFT substrate, wherein each pair of the metal pads comprise two of the first metal bumps; and
   providing a plurality of LED flip chips, and transferring the plurality of LED flip chips to the TFT substrate by using the transfer device to bond electrodes of each of the LED flip chips to one pair of the metal pads respectively;
   wherein providing the substrate to form the plurality of first metal bumps on the substrate comprises: coating the substrate with a release adhesive; sequentially evaporating a first metal layer, a second metal layer and a third metal layer on the release adhesive to form a metal pad layer; and patterning the metal pad layer to form the plurality of first metal bumps.

2. The bonding method according to claim 1, further comprising:
   providing a first electrical performance detection device to detect electrical performance of each of the LED flip chips on the TFT substrate to obtain a detection result;
   determining whether each of the LED flip chips on the TFT substrate is bonded to each pair of the metal pads according to the detection result; and
   under the condition that any one of the LED flip chips is not bonded to the metal pad which is contacted with the LED flip chip, repairing the LED flip chip.

3. The bonding method according to claim 1, before transferring the plurality of LED flip chips to the TFT substrate by using the transfer device, the method further comprising:
   forming second metal bumps on the electrodes of each of the LED flip chips by means of evaporation to form a plurality of new LED flip chips; and
   transferring the plurality of LED flip chips to the TFT substrate by using the transfer device to bond the electrodes of each of the LED flip chips to one pair of the metal pads respectively comprises:
   transferring the plurality of new LED flip chips to the TFT substrate by using the transfer device, such that two of the second metal bumps on each of the new LED flip chips form eutectic bonding with the third metal layer in two of the first metal bumps in one pair of the metal pads.

4. The bonding method according to claim 2, wherein providing the substrate to form the plurality of first metal bumps on the substrate comprises:
   coating the substrate with a release adhesive;

sequentially evaporating a first metal layer, a second metal layer and a third metal layer on the release adhesive to form a metal pad layer; and patterning the metal pad layer to form the plurality of first metal bumps.

5. A display backplane, comprising:

a plurality of first metal bumps;

a TFT substrate, wherein the plurality of first metal bumps are transferred to the TFT substrate and the plurality of first metal bumps are eutectically bonded to metal pad blocks on the TFT substrate; and a plurality of LED flip chips, wherein the plurality of LED flip chips are transferred to the TFT substrate, and the plurality of LED flip chips are eutectically bonded to the plurality of first metal bumps on the TFT substrate respectively;

wherein each of the plurality of first metal bumps comprises a first metal layer, a second metal layer and a third metal layer; wherein the first metal layer is eutectically bonded to one of the metal pad blocks, the second metal layer is arranged on the first metal layer, and the third metal layer is arranged on the second metal layer.

6. The display backplane according to claim 5, wherein each of the plurality of LED flip chips comprises a light emitting diode and two second metal bumps;

wherein one ends of the two second metal bumps are respectively bound on two electrodes of the light emitting diode; and the other ends of the two second metal bumps are eutectically bonded to two of the third metal layers.

7. A system for manufacturing a display backplane, comprising:

a substrate, wherein the substrate comprises a plurality of first metal bumps;

a TFT substrate, wherein a plurality of metal pad blocks is set on the TFT substrate;

a plurality of LED flip chips; and a transfer device, wherein the transfer device is used for transferring the plurality of first metal bumps to the TFT substrate so as to eutectically bond the plurality of first metal bumps to the metal pad blocks on the TFT substrate; and the transfer device is further used for transferring the plurality of LED flip chips to the TFT substrate, such that the plurality of LED flip chips are eutectically bonded to the plurality of first metal bumps on the TFT substrate separately;

wherein each of the plurality of first metal bumps comprises a first metal layer, a second metal layer and a third metal layer; wherein the first metal layer is eutectically bonded to one of the metal pad blocks, the second metal layer is arranged on the first metal layer, and the third metal layer is arranged on the second metal layer.

8. The system for manufacturing the display backplane according to claim 7, further comprising:

a first electrical performance detection device, configured to detect electrical performance of each of the LED flip chips on the TFT substrate.

9. The system for manufacturing the display backplane according to claim 7, further comprising:

a second electrical performance detection device, configured to detect whether the metal pad blocks on the TFT substrate is bonded to the first metal bumps.

10. The system for manufacturing the display backplane according to claim 8, further comprising:

a second electrical performance detection device, configured to detect whether the metal pad blocks on the TFT substrate is bonded to the first metal bumps.

\* \* \* \* \*